United States Patent
Wasekura

(10) Patent No.: US 9,568,505 B2
(45) Date of Patent: Feb. 14, 2017

(54) SEMICONDUCTOR DEVICE

(71) Applicant: TOYOTA JIDOSHA KABUSHIKI KAISHA, Toyota-shi, Aichi (JP)

(72) Inventor: Masaki Wasekura, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/910,467

(22) PCT Filed: Sep. 3, 2014

(86) PCT No.: PCT/JP2014/073227
§ 371 (c)(1),
(2) Date: Feb. 5, 2016

(87) PCT Pub. No.: WO2015/064206
PCT Pub. Date: May 7, 2015

(65) Prior Publication Data
US 2016/0231358 A1 Aug. 11, 2016

(30) Foreign Application Priority Data
Oct. 31, 2013 (JP) .................................. 2013-227678

(51) Int. Cl.
H03K 19/00 (2006.01)
G01R 15/14 (2006.01)
H03K 17/082 (2006.01)
H03K 17/567 (2006.01)
H03K 17/74 (2006.01)

(52) U.S. Cl.
CPC ......... *G01R 15/146* (2013.01); *H03K 17/0828* (2013.01); *H03K 17/567* (2013.01); *H03K 17/74* (2013.01); *H03K 2217/0027* (2013.01)

(58) Field of Classification Search
None
See application file for complete search history.

(56) References Cited

U.S. PATENT DOCUMENTS

2016/0233788 A1* 8/2016 Osanai .................... H02M 1/08
2016/0233856 A1* 8/2016 Wasekura .......... H03K 17/0828
2016/0269007 A1* 9/2016 Wasekura .......... H03K 17/0828

FOREIGN PATENT DOCUMENTS

JP 2008-072848 A 3/2008
JP 2009-268054 A 11/2009

* cited by examiner

Primary Examiner — Long Nguyen
(74) Attorney, Agent, or Firm — Oliff PLC

(57) ABSTRACT

A semiconductor device includes a transistor; a diode configured to be connected in reverse-parallel with the transistor; a sense transistor configured to have a current flow in the sense transistor, depending on a current flowing in the transistor; a sense diode configured to have a current flow in the sense diode, depending on a current flowing in the diode; a resistor configured to have one terminal connected with an emitter of the sense transistor and an anode of the sense diode, and another terminal connected with an emitter of the transistor and an anode of the diode; and a current mirror configured to be connected in parallel with the resistor, and to output a current depending on a current flowing in a same direction as a forward direction of the sense diode.

8 Claims, 6 Drawing Sheets

SEMICONDUCTOR DEVICE

TECHNICAL FIELD

The disclosures herein generally relate to a semiconductor device.

BACKGROUND ART

Conventionally, a technology has been known that detects a current flowing in a transistor, and a current flowing in a diode that is connected in reverse-parallel with the transistor, by a common sense resistor (see, for example, Patent Document 1).

RELATED-ART DOCUMENTS

Patent Documents

[Patent Document 1] Japanese Laid-open Patent Publication No. 2009-268054

SUMMARY OF THE INVENTION

Problem to be Solved by Invention

For example, to detect a comparatively great current flowing in a transistor, the resistance value of a sense resistor may be set low. However, the lower the resistance value of the sense resistor is, the lower the detection sensitivity of the current by the sense resistor is. Therefore, for a sense resistor of the conventional technology described above, it is difficult to detect with high precision, for example, a current around zero amperes flowing in the diode connected in reverse-parallel with the transistor.

Thereupon, it is an object of at least one embodiment to provide a semiconductor device that can raise the detection sensitivity of a current flowing in a diode connected in reverse-parallel with a transistor.

Means to Solve the Problem

According to an embodiment, a semiconductor device includes a transistor; a diode configured to be connected in reverse-parallel with the transistor; a sense transistor configured to have a current flow in the sense transistor, depending on a current flowing in the transistor; a sense diode configured to have a current flow in the sense diode, depending on a current flowing in the diode; a resistor configured to have one terminal connected with an emitter of the sense transistor and an anode of the sense diode, and another terminal connected with an emitter of the transistor and an anode of the diode; and a current mirror configured to be connected in parallel with the resistor, and to output a current depending on a current flowing in a same direction as a forward direction of the sense diode.

Advantage of the Invention

According to an embodiment, it is possible to raise the detection sensitivity of a current flowing in a diode connected in reverse-parallel with a transistor.

MODE FOR CARRYING OUT THE INVENTION

In the following, embodiments will be described with reference to the drawings.

Figure 1:
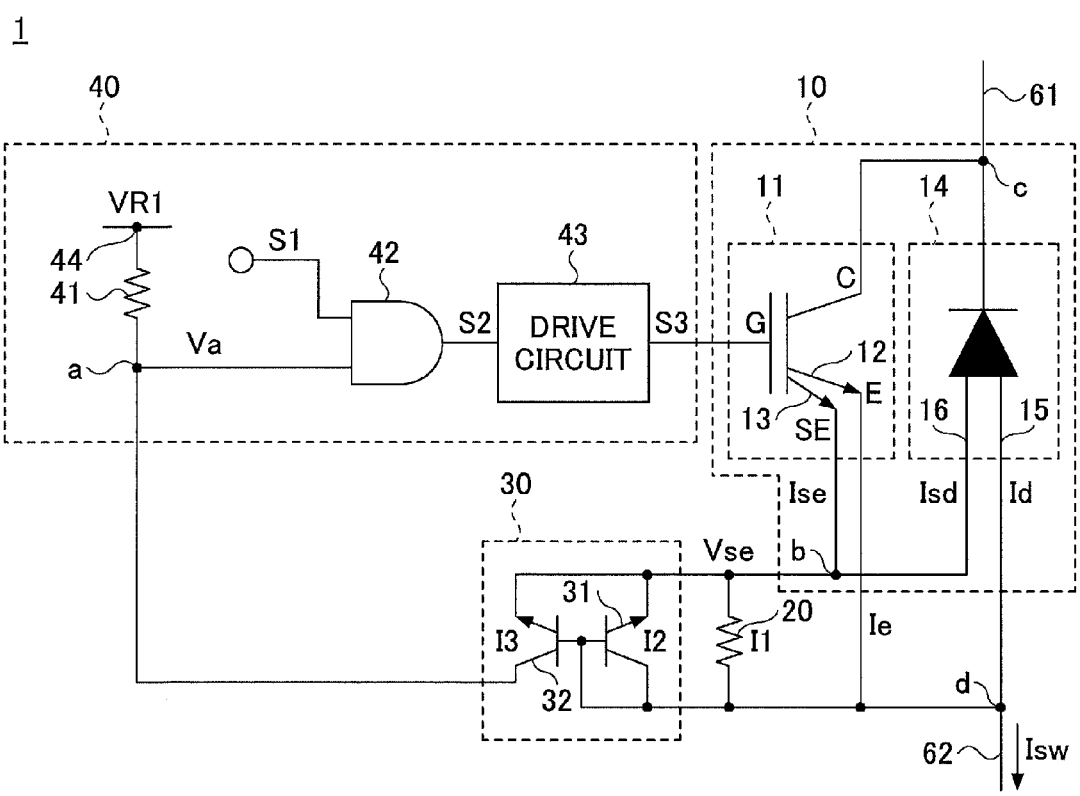
FIG. 1 is a configuration diagram of a semiconductor device according to an embodiment.

FIG. 1 is a diagram that illustrates a configuration example of a drive device 1 as an example of a semiconductor device. The drive device 1 may be a semiconductor device that has a configuration implemented by an integrated circuit, or a semiconductor device that has a configuration implemented by discrete parts.

The drive device 1 is a semiconductor circuit that includes a unit to drive an inductive load (for example, an inductor or a motor) connected with a first conductive part 61 or a second conductive part 62, by driving on and off a main transistor 12 of a transistor part 11. Devices that use one or more drive devices 1 include, for example, a converter that boosts or steps down DC power, an inverter that converts power between DC power and AC power, and the like.

For example, in a device that uses multiple drive devices 1, a switching circuit is disposed in which switching elements 10 are connected in series. The switching elements 10 are provided on a high side and on a low side with respect to an intermediate node with which an inductive load is connected. For example, a three-phase inverter that uses multiple drive devices 1 includes three of such switching circuits in parallel.

The conductive part 61 is a current path that is conductively connected with a high-power-potential part such as a positive electrode of a power source, or may be indirectly connected with the high-power-potential part via another switching element or a load. The conductive part 62 is a current path that is conductively connected with a low-power-potential part such as a negative electrode of a power source (for example, a ground potential part), or may be indirectly connected with the low-power-potential part via another switching element or a load.

The drive device 1 includes the switching element 10. The switching element 10 is an insulated-gate, voltage-controlled semiconductor element having a current sense function. The switching element 10 includes the transistor part 11 and a diode part 14.

For example, if the transistor part 11 is an insulated-gate bipolar transistor (IGBT), the switching element 10 is a diode-built-in IGBT that has the transistor part 11 and the diode part 14 disposed on a common semiconductor substrate. The diode-built-in IGBT has a structure that includes a common electrode for the anode electrode of the diode and the emitter electrode of the IGBT, and a common electrode for the cathode electrode of the diode and the collector electrode of the IGBT. The diode-built-in IGBT is also called the "reverse conducting IGBT (RC-IGBT).

As a specific example of the transistor part 11, one may consider a power transistor element such as an IGBT and a metal-oxide semiconductor field-effect transistor (MOSFET). FIG. 1 illustrates an IGBT as an example of the transistor part 11. In the following description, it is assumed that the transistor part 11 is an IGBT for the sake of explanation. If it is a MOSFET, the wording may be changed to read a "collector" as a "drain", and an "emitter" as a "source".

The gate terminal G of the transistor part 11 is, for example, a control terminal connected with a drive circuit 43 of a control circuit 40 via a gate resistor connected in series with the gate terminal G. The collector terminal C of the transistor part 11 is a first main terminal connected with, for example, a connection point c, and connected with the conductive part 61 via the connection point c. The emitter terminal E of the transistor part 11 is a second main terminal connected with, for example, a connection point d, and connected with the conductive part 62 via the connection point d. The sense emitter terminal SE of the transistor part 11 is a sense terminal connected with, for example, a connection point b, and connected with one terminal of a sense resistor 20 via the connection point b. The sense emitter terminal SE is connected with the conductive part 62 via the connection point d connected with another terminal of the sense resistor 20.

The transistor part 11 is configured to include the main transistor 12 and a sense transistor 13. The main transistor 12 and the sense transistor 13 are switching elements such as IGBTs. The sense transistor 13 is connected in parallel with the main transistor 12. The main transistor 12 and the sense transistor 13 may be configured with multiple cell transistors, respectively.

Respective gate electrodes g of the main transistor 12 and the sense transistor 13 are control electrodes commonly connected with the gate terminal G of the transistor part 11. Respective collector electrodes c of the main transistor 12 and the sense transistor 13 are first main electrodes commonly connected with the collector terminal C of the transistor part 11. The emitter electrode e of the main transistor 12 is a second main electrode connected with the emitter terminal E of the transistor part 11. The sense emitter electrode se of the sense transistor 13 is the sense electrode connected with the sense emitter terminal SE of the transistor part 11.

The sense transistor 13 is an example of a sense transistor that generates a current depending on a current flowing in the main transistor 12, and is a sense element in which a greater current flows when a greater current flows in the main transistor 12. The sense transistor 13 outputs, for example, a sense current Ise that is proportional to a principal current Ie flowing in the main transistor 12.

For example, a collector current flowing from the collector terminal C into the transistor part 11 is divided into the principal current Ie flowing in the main transistor 12, and the sense current Ise flowing in the sense transistor 13, by a sense ratio n. The sense current Ise is a current that flows depending on the principal current Ie by the sense ratio n, and its current value is made smaller than the principal current Ie by the sense ratio n. The sense ratio n is determined, for example, depending on a ratio of the area of the emitter electrode e of the main transistor 12, and the area of the sense emitter electrode se of the sense transistor 13.

The principal current Ie flows in the collector electrode c and the emitter electrode e of the main transistor 12, and is output from the emitter terminal E. The principal current Ie output from the emitter terminal E flows in the conductive part 62 via the connection point d. The sense current Ise flows in the collector electrode c and the sense emitter electrode se of the sense transistor 13, and is output from the sense emitter terminal SE. The sense current Ise output from the sense emitter terminal SE flows in the conductive part 62 via the sense resistor 20 and the connection point d.

On the other hand, the diode part 14 is configured to include a main diode 15 and a sense diode 16.

The main diode 15 is an example of a diode connected in reverse-parallel with the main transistor 12, has the anode connected with the emitter terminal E, and the cathode connected with the collector terminal C. The anode electrode of the main diode 15 is a P-type electrode connected with the connection point d connected with the emitter terminal E, and connected with the conductive part 62 via the connection point d. The cathode electrode of the main diode 15 is an N-type electrode connected with the connection point c connected with the collector terminal C, and connected with the conductive part 61 via the connection point c.

The sense diode 16 is an example of a sense diode in which a current flows depending on a current flowing in the main diode 15, and is a sense element in which a greater current flows when a greater current flows in the main diode 15. The sense diode 16 outputs, for example, a sense diode current Isd that is proportional to a diode current Id flowing in the main diode 15.

The sense diode current Isd is a current that flows depending on the diode current Id by a sense ratio m, and its current value is made smaller than the diode current Id by the sense ratio m.

The anode electrode of the sense diode 16 is a P-type electrode connected with the connection point b connected with the sense emitter terminal SE, and connected with the conductive part 62 via the sense resistor 20 and the connection point d. The cathode electrode of the sense diode 16 is an N-type electrode connected with the connection point c connected with the collector terminal C, and connected with the conductive part 61 via the connection point c.

The drive device 1 has the sense resistor 20 disposed between the sense emitter terminal SE and the emitter terminal E. The sense resistor 20 is an example of a resistor that has one terminal commonly connected with the sense emitter electrode se of the sense transistor 13 and the anode electrode of the sense diode 16, and another terminal commonly connected with the emitter electrode e of the main transistor 12 and the anode electrode of the main diode 15.

The drive device 1 includes a current mirror circuit 30. The current mirror circuit 30 is an example of a current mirror that is connected in parallel with the sense resistor 20. The current mirror circuit 30 outputs an output current I3 depending on an input current I2 flowing in the same direction as the forward direction of the sense diode 16.

By having the current mirror circuit 30 like this connected in parallel with the sense resistor 20, the output current I3 can be generated that flows depending on the magnitude of the diode current Id. Therefore, the magnitude of the diode current Id can be detected by the magnitude of the output current I3 of the current mirror circuit 30, which is a detection unit different from the sense resistor 20. Therefore, the current mirror ratio k of the current mirror circuit 30 can be adjusted independently from the resistance value of the sense resistor 20, and hence, even if the resistance value of the sense resistor 20 is low, the detection sensitivity of the diode current Id can be easily raised by adjusting the current mirror ratio k.

For example, while the diode current Id decreases, the input current I2 also decreases. Even if the current value of the input current I2 takes a value a bit greater than zero, by adjusting the current mirror ratio k of the output current I3 with respect to the input current I2, an output current I3 whose current value is greater than an input current I2 can be generated easily. Therefore, it is possible to detect a diode current Id a bit greater than zero flowing in the main diode 15, by the output current I3 with high precision.

Upon flowing into the current mirror circuit 30, the input current I2 that flows depending on the magnitude of the diode current Id is converted into the output current I3, which is a current copied by the current mirror ratio k of the current mirror circuit 30. On the other hand, upon flowing into the sense resistor 20, the sense current Ise that flows depending on the magnitude of the principal current Ie is converted into a sense voltage Vse generated between both terminals of the sense resistor 20. In other words, the diode current Id can be detected by the current mirror circuit 30, and the principal current Ie can be detected by the sense resistor 20. Therefore, the detection sensitivity of the diode current Id by the current mirror circuit 30, and the detection sensitivity of the principal current Ie by the sense resistor 20 can be adjusted independently.

The current mirror circuit 30 includes, for example, an input transistor 31 and an output transistor 32. The input transistor 31 is connected in parallel with the sense resistor 20, into which the input current I2 flows as input. The output transistor 32 outputs the output current I3 depending on the input current I2 by the current mirror ratio k.

The input transistor 31 is a diode-connected transistor, for example, an NPN transistor that has the emitter connected with one terminal of the sense resistor 20 and the collector and base commonly connected with the other terminal of the sense resistor 20. The output transistor 32 is an NPN transistor that has the emitter connected with the emitter of the input transistor 31 and the one terminal of the sense resistor 20, the base connected with the base and collector of the input transistor 31, and the collector connected with one terminal part of a resistor 41 of the control circuit 40. The NPN transistor may be replaced with another switching element such as a MOSFET.

The input transistor 31 and the output transistor 32 have PN junctions between the bases and the emitters, respectively, and hence, can prevent the sense current Ise that flows in the sense transistor 13, from flowing into the current mirror circuit 30. In other words, the sense current Ise does not flow in the current mirror circuit 30, but flows in the sense resistor 20.

On the other hand, a current flowing depending on the diode current Id is divided to flow in the sense resistor 20 and the current mirror circuit 30, and then, joined to flow in the sense diode 16. When the diode current Id flows, the resistor current I1 proportional to the diode current Id flows in the sense resistor 20, the input current I2 proportional to the diode current Id flows, and the output current I3 proportional to the diode current Id (or the input current I2) flows. When the diode current Id flows, for example, the input current I2 is a current greater than the resistor current I1.

The drive device 1 includes the control circuit 40. The control circuit 40 is an example of a control unit to control driving the main transistor 12 and the sense transistor 13, based on the output of the current mirror circuit 30.

When the output current I3 that flows depending on the input current I2 is output from the current mirror circuit 30 depending on the flow of the diode current Id, the control circuit 40 turns off the main transistor 12 and the sense transistor 13. Thus, when the diode current Id flows, the main transistor 12 and the sense transistor 13 can be prevented from being turned on. Also, when the diode current Id flows, the loss in the diode part 14 can be prevented from increasing, which could happen if the main transistor 12 and the sense transistor 13 were turned on.

For example, the control circuit 40 turns off the main transistor 12 and the sense transistor 13 when the current value of the output current I3 is detected to be greater than or equal to a predetermined threshold (for example, a current value greater than or equal to zero).

The control circuit 40 includes the resistor 41, an AND circuit 42, and the drive circuit 43.

The resistor 41 is an example of a conversion unit that converts the output current I3 into a detection voltage Va. The resistor 41 has the one terminal connected with the collector of the output transistor 32 included in the current mirror circuit 30, and the other terminal connected with a reference voltage part 44 that outputs a constant reference voltage VR1. A connection point a between the one terminal of the resistor 41 and the collector of the output transistor 32 is connected with the AND circuit 42. The detection voltage Va output from the connection point a is input into the AND circuit 42.

When the diode current Id flows, a voltage drop is generated in the resistor 41 by the output current I3 flowing in the resistor 41. Therefore, the detection voltage Va is a low-level signal that commands to turn off the main transistor 12 and the sense transistor 13. On the other hand, when the diode current Id does not flow, a voltage drop is not generated in the resistor 41 because the output current I3 does not flow in the resistor 41. Therefore, the detection voltage Va is a high-level signal that commands to turn on the main transistor 12 and the sense transistor 13.

The AND circuit 42 is an example of a determination unit that determines whether to turn on or off the main transistor 12 and the sense transistor 13, based on the voltage level of a command signal S1 and the voltage level of the detection voltage Va. The AND circuit 42 calculates the logical AND of the command signal S1 and the detection voltage Va, and outputs a pre-drive signal S2. The command signal S1 is a signal commanding to turn on or off the main transistor 12 and the sense transistor 13, and is a signal supplied from an external device such as a microcomputer (for example, a pulse-width modulation signal).

The AND circuit 42 outputs a low-level pre-drive signal S2 if at least one of the command signal S1 and the detection voltage Va is a low-level signal commanding to turn off the main transistor 12 and the sense transistor 13. The low-level pre-drive signal S2 is a signal to turn off the main transistor 12 and the sense transistor 13. In other words, the AND circuit 42 outputs a low-level pre-drive signal S2 if the detection voltage Va takes the low level even if receiving a high-level command signal S1 commanding to turn on the main transistor 12 and the sense transistor 13.

On the other hand, the AND circuit 42 outputs a high-level pre-drive signal S2 if both the command signal S1 and the detection voltage Va5 are high-level signals commanding to turn on the main transistor 12 and the sense transistor 13. A high-level pre-drive signal S2 is a signal to turn on the main transistor 12 and the sense transistor 13.

The drive circuit 43 outputs a gate drive signal S3 having the same phase as the pre-drive signal S2 output from the AND circuit 42. The drive circuit 43 shifts the voltage level of the pre-drive signal S2 high enough to drive the main transistor 12 and the sense transistor 13, and outputs the gate drive signal S3 whose voltage level is greater than the voltage level of the pre-drive signal S2.

Figure 2:
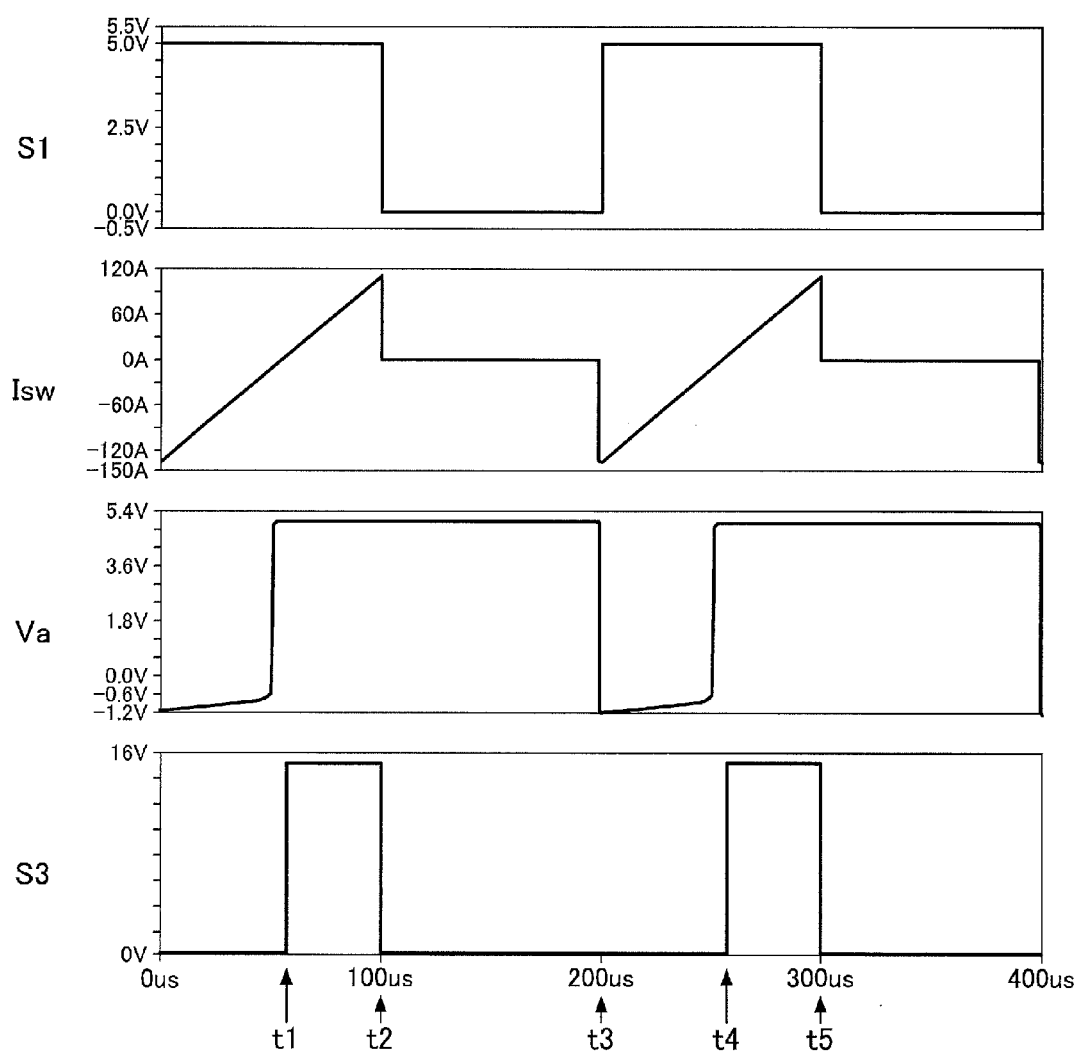
FIG. 2 is a timing chart illustrating an example of operational waveforms of a semiconductor device.

FIG. 2 is a timing chart that illustrates an example of operational waveforms of the drive device 1. The command signal S1 is a signal commanding to turn on or off the main transistor 12 and the sense transistor 13. A current Isw is a current flowing in the conductive part 62, and virtually equivalent to the sum of the principal current Ie and the diode current Id. Note that since the sense current Ise is sufficiently less than the principal current Ie, and the sense diode current Isd is sufficiently less than the diode current Id, the magnitude of the sense current Ise and the sense diode current Isd is negligible with respect to the current Isw.

A period during which the current Isw takes a negative value, represents that the current Isw flows in the same direction as in the forward direction of the main diode 15 and the sense diode 16. The forward direction of the main diode 15 and the sense diode 16 is a direction from the anode electrode to the cathode electrode. On the other hand, a period during which the current Isw takes a positive value, represents that the current Isw flows in a direction reverse to the forward direction of the main diode 15 and the sense diode 16. The direction reverse to the forward direction of the main diode 15 and the sense diode 16 is a direction from the collector terminal C to the emitter terminal E or the sense emitter terminal SE.

When the diode current Id flows, the detection voltage Va takes a low-level negative voltage. Therefore, if the command signal S1 takes the high level, and the detection voltage Va takes the low level, then, the gate drive signal S3 takes the low level, and hence, both the main transistor 12 and the sense transistor 13 are turned off. By having both the main transistor 12 and the sense transistor 13 turned off, the flow of the principal current Ie and the sense current Ise is cut off. Therefore, when the flow of the principal current Ie and the sense current Ise is cut off, the current Isw is virtually equivalent to the sum of the diode current Id, the resistor current I1, and the input current I2.

While the diode current Id decreases, the sense diode current Isd also decreases. The sense diode current Isd is virtually equivalent to the sum of the resistor current I1, the input current I2, and the output current I3. When the diode current Id decreases to zero amperes, the current Isw also decreases to virtually zero amperes. Around zero amperes where the current Isw switches from negative to positive, the detection voltage Va switches from the low level to the high level (see timings t1 and t4). Thus, the gate drive signal S3 takes the high level.

Therefore, when the command signal S1 takes the high level and the detection voltage Va takes the high level, the gate drive signal S3 takes the high level, and hence, both the main transistor 12 and the sense transistor 13 are turned on. By having both the main transistor 12 and the sense transistor 13 turned on, the principal current Ie and the sense current Ise increase gradually, and hence, the current Isw also increases gradually (see period t1-t2 and period t4-t5).

When the command signal S1 switches from the high level to the low level, the gate drive signal S3 switches from the high level to the low level (see timings t2 and t5), and hence, both the main transistor 12 and the sense transistor 13 are turned off. By having both the main transistor 12 and the sense transistor 13 turned off, the flow of the principal current Ie and the sense current Ise is cut off (see period t2-t3).

In this way, if the diode current Id even a bit greater than zero flows in the main diode 15, by adjusting the current mirror ratio k of the current mirror circuit 30, it is possible to flow the output current I3 greater than or equal to a predetermined value to a certain extent. Thus, at timing when the diode current Id stops or starts flowing (in the case of FIG. 2, timing t1, t3, or t4 when the current Isw changes from negative to positive or positive to negative), it is easily possible to implement changing the detection voltage Va steeply.

Also, the resistance value of the resistor 41 and the resistance value of the sense resistor 20 can be adjusted independently. Therefore, the resistance value of the resistor 41 can be raised easily so that the voltage drop of the resistor 41 becomes greater. Thus, at timing when the diode current Id stops or starts flowing (in the case of FIG. 2, timing t1, t3, or t4 when the current Isw changes from negative to positive or positive to negative), it is easily possible to implement changing the detection voltage Va steeply.

Figure 3:
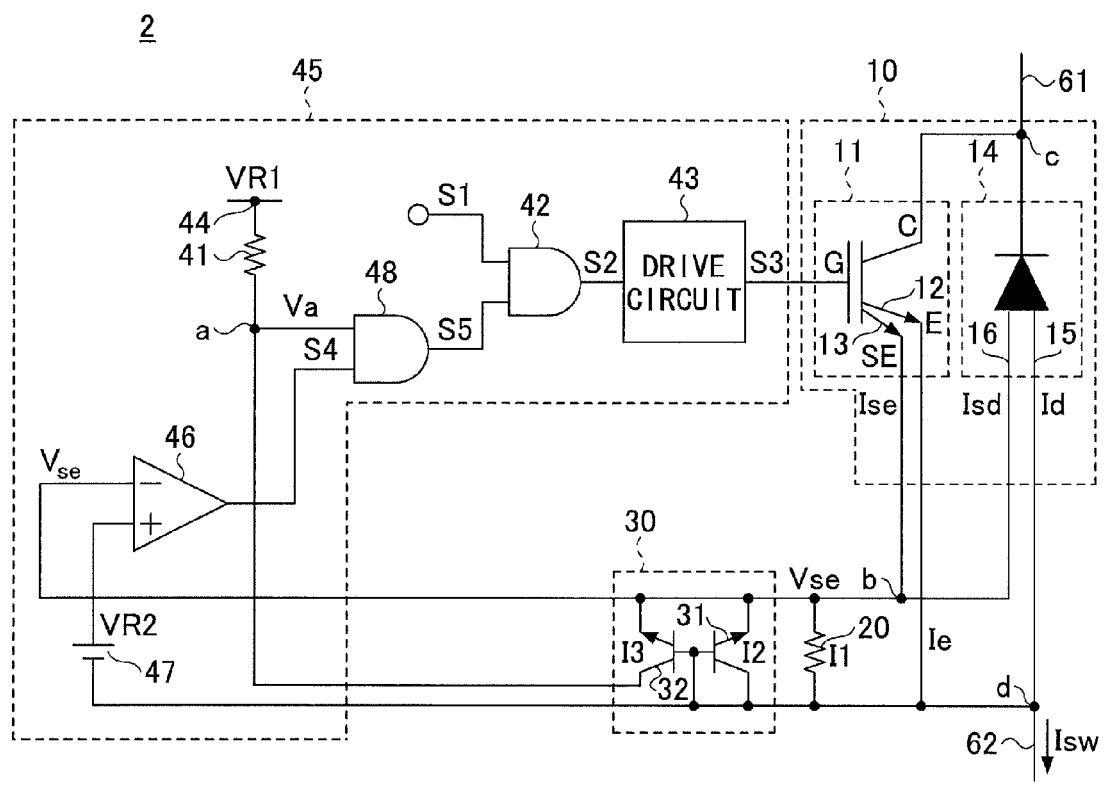
FIG. 3 is a configuration diagram of a semiconductor device according to an embodiment.

FIG. 3 is a diagram that illustrates a configuration example of a drive device 2 as an example of a semiconductor device. Description is omitted here for the same elements and effects as in the configuration example of the drive device described above. The drive device 2 includes a control circuit 45 having an overcurrent detection circuit to turn off the main transistor 12 and the sense transistor 13, based on a sense voltage Vse generated by the resistor current I1 flowing in the sense resistor 20.

A comparator 46 is an example of the overcurrent detection circuit. The comparator 46 has an inverted input part connected with one terminal of the sense resistor 20, and a non-inverted input part connected with a reference voltage part 47 that outputs a constant reference voltage VR2. The reference voltage VR2 is a threshold voltage to determine whether the principal current Ie is an overcurrent.

When the diode current Id flows, the comparator 46 outputs a high-level output signal S4 because the sense voltage Vse is lower than the reference voltage VR2. Also, when a normal principal current Ie less than an overcurrent flows in the main transistor 12, the comparator 46 outputs a high-level output signal S4 because the sense voltage Vse is lower than the reference voltage VR2. Also, when an excessive principal current Ie greater than or equal to a predetermined value flows in the main transistor 12, the comparator 46 outputs a low-level output signal S4 because the sense voltage Vse is greater than the reference voltage VR2.

The control circuit 45 includes an AND circuit 48 that takes, as input, the output signal S4 of the comparator 46. The AND circuit 48 is an example of a determination unit that determines whether to turn on or off the main transistor 12 and the sense transistor 13, based on the voltage level of the output signal S4 and the voltage level of the detection voltage Va. The AND circuit 48 calculates the logical AND of the output signal S4 and the detection voltage Va, and outputs an output signal S5.

The AND circuit 42 is an example of a determination unit that determines whether to turn on or off the main transistor 12 and the sense transistor 13, based on the voltage level of the command signal S1 and the voltage level of the output signal S5. The AND circuit 42 calculates the logical AND of the command signal S1 and the output signal S5, and outputs a pre-drive signal S2.

Thus, the control circuit 40 can turn off the main transistor 12 and the sense transistor 13 when detecting at least one of the diode current Id flowing in the main diode 15, and an excessive principal current Ie flowing in the main transistor 12. On the other hand, if detecting a normal principal current Ie flowing in the main transistor 12, the control circuit 40 can turn on the main transistor 12 and the sense transistor 13.

Figure 4:
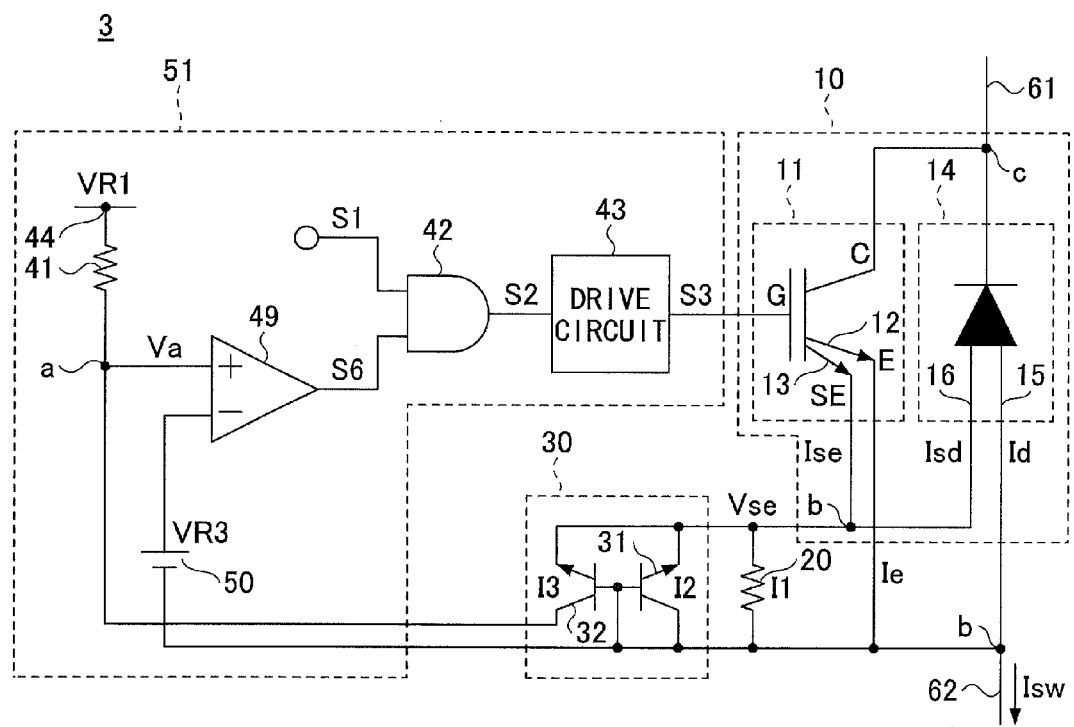
FIG. 4 is a configuration diagram of a semiconductor device according to an embodiment.

FIG. 4 is a diagram that illustrates a configuration example of a drive device 3 as an example of a semiconductor device. Description is omitted here for the same elements and effects as in the configuration example of the drive device described above. The drive device 3 includes a control circuit 51 having an output detection circuit to detect whether the output current I3 is output.

A comparator 49 is an example of the output detection circuit. The comparator 49 has a non-inverted input part connected with the connection point a, and an inverted input part connected with a reference voltage part 50 that outputs a constant reference voltage VR3. The reference voltage VR3 is a threshold voltage to determine whether the principal current Ie or the output current I3 flows.

When the diode current Id flows, the comparator 49 outputs a low-level output signal S6 because the detection voltage Va is lower than the reference voltage VR3. When the diode current Id does not flow, the comparator 49 outputs a high-level output signal S6 because the detection voltage Va is higher than the reference voltage VR3. The output signal S6 of the comparator 49 is input into the AND circuit 42.

As illustrated in FIG. 1, it is possible to detect whether the diode current Id flows, without the comparator 49. However, if the comparator 49 is provided as in FIG. 4, the voltage value of the reference voltage VR3 can be adjusted, and hence, degrees of freedom can be raised to adjust the detection sensitivity of the diode current Id.

Figure 5:
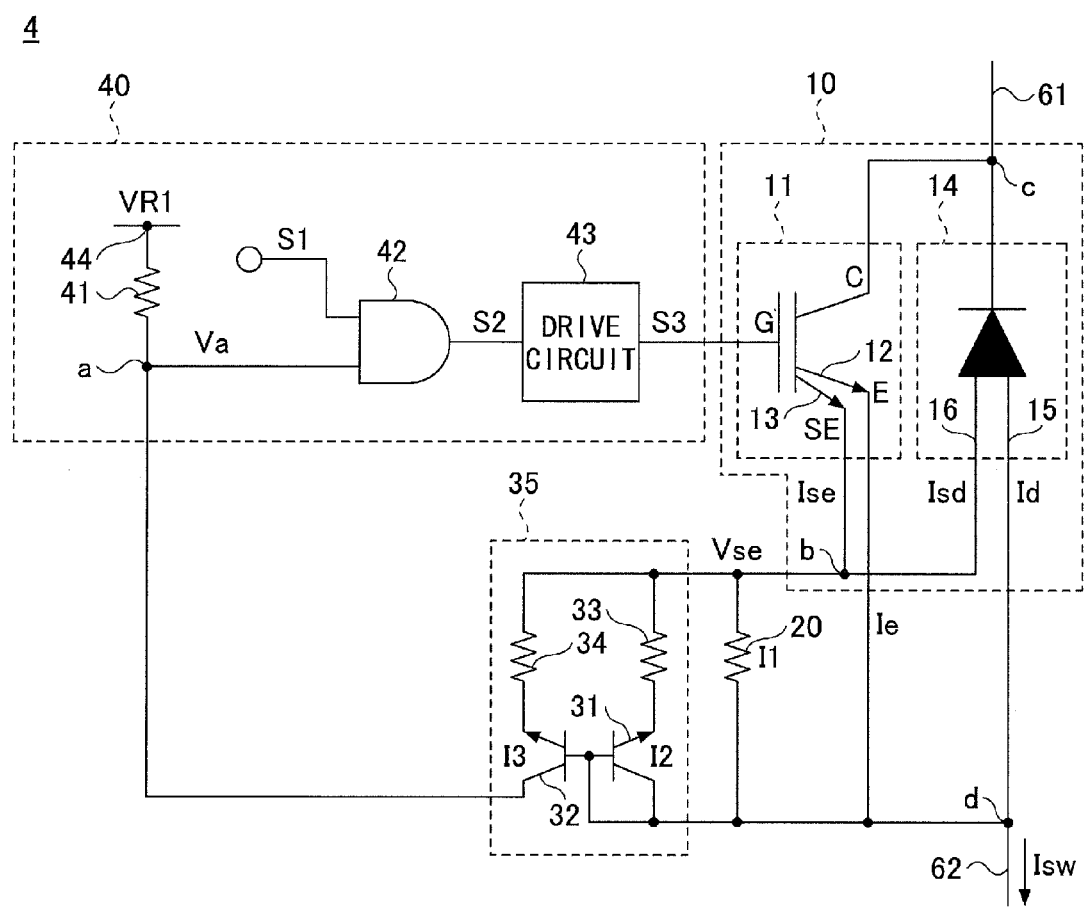
FIG. 5 is a configuration diagram of a semiconductor device according to an embodiment.

FIG. 5 is a diagram that illustrates a configuration example of a drive device 4 as an example of a semiconductor device. Description is omitted here for the same elements and effects as in the configuration example of the drive device described above. A current mirror circuit 35 includes emitter resistors 33 and 34. The emitter resistor 33 has one terminal connected with the emitter of the input transistor 31 and the other terminal connected with one terminal of the sense resistor 20. The emitter resistor 34 has one terminal connected with the emitter of the output transistor 32 and the other terminal connected with the one terminal of the sense resistor 20.

By providing the emitter resistors 33 and 34, the ratio of respective currents flowing in the current mirror circuit 35 and the sense resistor 20 can be adjusted, and hence, degrees of freedom can be further raised to adjust the detection sensitivity.

Figure 6:
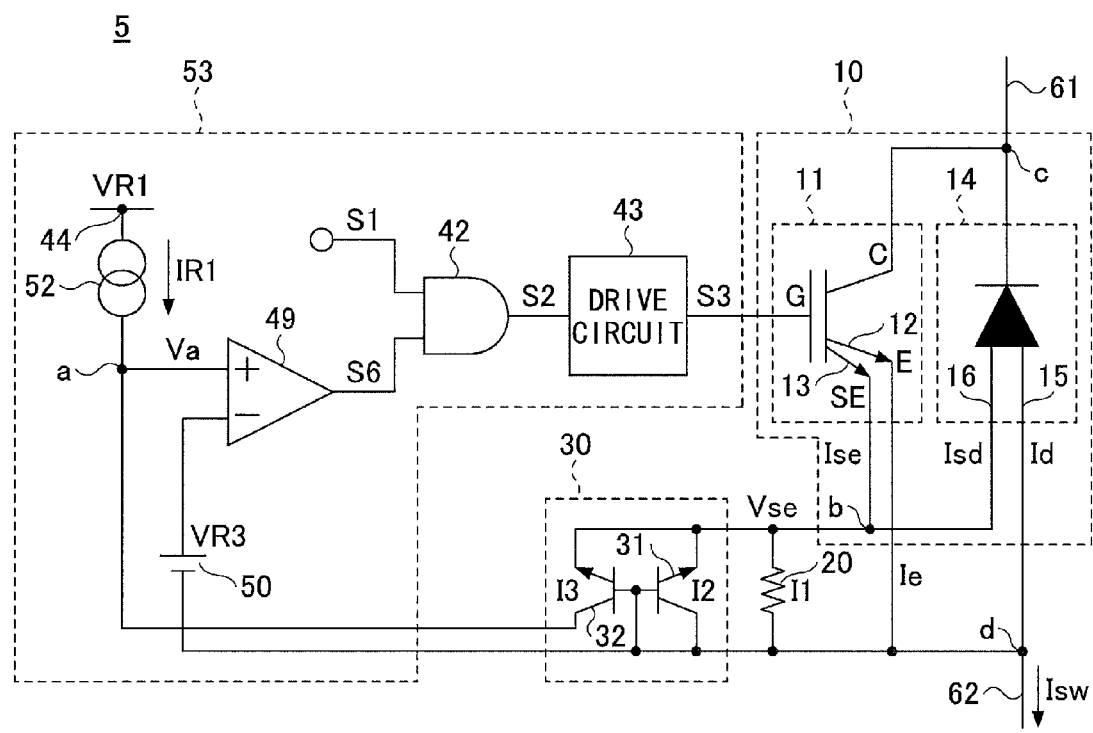
FIG. 6 is a configuration diagram of a semiconductor device according to an embodiment.

FIG. 6 is a diagram that illustrates a configuration example of a drive device 5 as an example of a semiconductor device. Description is omitted here for the same elements and effects as in the configuration example of the drive device described above. The drive device 5 includes a control circuit 53 having a constant current source 52 to supply a constant current IR1 that is generated based on the reference voltage VR1, to the output transistor 32 of the current mirror circuit 30. The constant current source 52 is an example of a conversion unit that converts the output current I3 into the detection voltage Va.

When the output current I3 of the current mirror circuit 30 becomes greater than the constant current IR1, the detection voltage Va is switched from the high level to the low level. When the output current I3 becomes less than the constant current IR1, the detection voltage Va is switched from the low level to the high level. By providing the constant current source 52 like this, it is possible to prevent the detection voltage Va from fluctuating due to fluctuation of the reference voltage VR1.

Note that the comparator 49 and the reference voltage part 50 in FIG. 6 may be omitted as illustrated in FIG. 1.

The semiconductor device has been described with the embodiments as above. Note that the present invention is not limited to the above embodiments. Various modifications and improvements can be made within the scope of the present invention, by combining and/or replacing a part of or all of the embodiments with the others.

For example, a switching element such as a transistor may be a switching element other than an IGBT, for example, an N-channel MOSFET or a P-channel MOSFET.

The present application is based on Japanese Priority Application No. 2013-227678, filed on Oct. 31, 2013, the entire contents of which are hereby incorporated by reference.

DESCRIPTION OF REFERENCE SYMBOLS 1, 2, 3, 4, 5 drive device (example of semiconductor device)
10 switching element
11 transistor part
12 main transistor
13 sense transistor
14 diode part
15 main diode
16 sense diode
20 sense resistor
30, 35 current mirror circuit
31 input transistor
32 output transistor
40, 45, 51, 53 control circuit
44, 47, 50 reference voltage part
52 constant current source
61, 62 conductive part

The invention claimed is:

1. A semiconductor device, comprising:
   a transistor;
   a diode configured to be connected in reverse-parallel with the transistor;
   a sense transistor configured to have a current flow in the sense transistor, depending on a current flowing in the transistor;
   a sense diode configured to have a current flow in the sense diode, depending on a current flowing in the diode;
   a resistor configured to have one terminal connected with an emitter of the sense transistor and an anode of the sense diode, and another terminal connected with an emitter of the transistor and an anode of the diode; and
   a current mirror configured to be connected in parallel with the resistor, and to output a current depending on a current flowing in a same direction as a forward direction of the sense diode.

2. The semiconductor device as claimed in claim 1, wherein the current mirror includes
   an input transistor connected in parallel with the resistor, and receiving, as input, the current flowing in the same direction, and
   an output transistor to output a current depending on the current flowing in the same direction.

3. The semiconductor device as claimed in claim 2, wherein the input transistor and the output transistor have PN junctions, respectively, preventing the current flowing in the sense transistor, from flowing into the current mirror.

4. The semiconductor device as claimed in claim 2, further comprising:
   a conversion unit configured to convert the output current of the output transistor to a voltage.

5. The semiconductor device as claimed in claim 1, further comprising:
   a control unit configured to control driving the transistor, based on the output of the current mirror.

6. The semiconductor device as claimed in claim 5, wherein the control unit turns off the transistor when the current flows in the diode.

7. The semiconductor device as claimed in claim 6, wherein the control unit turns off the transistor when the current flows in the diode, even when receiving a command to turn on the transistor.

8. The semiconductor device as claimed in claim 5, wherein the control unit turns off the transistor when detecting at least one of the current flowing in the diode, and a current greater than or equal to a predetermined value flowing in the transistor.

* * * * *